(12) United States Patent
Umeda et al.

(10) Patent No.: US 11,309,232 B2
(45) Date of Patent: Apr. 19, 2022

(54) SEMICONDUCTOR DEVICE

(71) Applicant: SHINDENGEN ELECTRIC MANUFACTURING CO., LTD., Tokyo (JP)

(72) Inventors: Soichiro Umeda, Saitama (JP); Takenori Ishioka, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/630,690

(22) PCT Filed: Oct. 26, 2017

(86) PCT No.: PCT/JP2017/038755
§ 371 (c)(1),
(2) Date: Jan. 13, 2020

(87) PCT Pub. No.: WO2019/082343
PCT Pub. Date: May 2, 2019

(65) Prior Publication Data
US 2020/0395276 A1 Dec. 17, 2020

(51) Int. Cl.
*H01L 23/495* (2006.01)
*H01L 23/498* (2006.01)
*H01L 23/00* (2006.01)

(52) U.S. Cl.
CPC .. *H01L 23/49551* (2013.01); *H01L 23/49524* (2013.01); *H01L 23/49811* (2013.01);
(Continued)

(58) Field of Classification Search
CPC .............................................. H01L 23/49551
See application file for complete search history.

(56) References Cited

U.S. PATENT DOCUMENTS 6,307,272 B1 * 10/2001 Takahashi ......... H01L 23/49562
257/787
2008/0283983 A1 * 11/2008 Obara ............... H01L 23/49861
257/675
(Continued)

FOREIGN PATENT DOCUMENTS

JP      S57 6251 U      1/1982
JP      H01100957 A     4/1989
(Continued)

OTHER PUBLICATIONS

International Application No. PCT/JP2017/038755, International Search Report, dated Jan. 16, 2018.
(Continued)

*Primary Examiner* — Jasmine J Clark
(74) *Attorney, Agent, or Firm* — Marshall, Gerstein & Borun LLP

(57) ABSTRACT

A semiconductor device includes: a substrate; a semiconductor element that disposed on the upper surface of the substrate; a sealing portion that seals the substrate and the semiconductor element; a first lead frame that has one end in contact with a upper surface of the first conductive layer at an end extending in the side direction of the upper surface of the substrate in the sealing portion, and has the other end exposed from the sealing portion; a first conductive bonding material that bonds between the upper surface of the first conductive layer and the lower surface side of the one end portion of the first lead frame at the end portion of the substrate, and has electrical conductivity.

4 Claims, 15 Drawing Sheets

(52) U.S. Cl.
CPC .............. *H01L 24/32* (2013.01); *H01L 24/37* (2013.01); *H01L 24/73* (2013.01); *H01L 2224/32245* (2013.01); *H01L 2224/73201* (2013.01)

(56) References Cited

U.S. PATENT DOCUMENTS

2013/0320496 A1* 12/2013 Nishijima ......... H01L 23/49551 257/532
2017/0025331 A1 1/2017 Kamiyama et al.

FOREIGN PATENT DOCUMENTS

| | | |
|---|---|---|
| JP | H06181276 A | 6/1994 |
| JP | 2002-299541 A | 10/2002 |
| JP | 2009-049272 A | 3/2009 |
| JP | 2015-12065 A | 1/2015 |
| JP | 2015-026791 A | 2/2015 |
| JP | 2015-090965 A | 5/2015 |
| JP | 2017-174927 A | 9/2017 |
| WO | WO-2015/068557 A1 | 5/2015 |
| WO | WO-2016/084483 | 6/2016 |

OTHER PUBLICATIONS

International Application No. PCT/JP2017/038755, International Preliminary Report on Patentability, dated Apr. 30, 2020.
Supplementary European Search Report for European Application No. 17929433.5, dated Jul. 20, 2020.

* cited by examiner

SEMICONDUCTOR DEVICE

TECHNICAL FIELD

The present invention relates to a semiconductor device.

BACKGROUND ART

Conventionally, for example, a semiconductor device is known (see, for example, Patent Document 1). In the semiconductor device, a semiconductor element is placed on a conductor layer of a substrate, the semiconductor element and a lead frame are joined with a connector via a conductive bonding material such as solder, and the semiconductor element and the substrate are sealed with the resin.

In such a conventional semiconductor device, when a thermal stress is applied to the semiconductor device, a stress is generated at the joint portion of the lead frame. Thereby, there exists a problem which the reliability of the electrical connection of the said junction portion falls.

PRIOR ART DOCUMENTS

Patent Document

[Patent Document 1] JP2015-12065

DISCLOSURE OF THE INVENTION

Problem to be Solved by the Invention

Therefore, an object of the present invention is to provide a semiconductor device that, when the stress is applied to the lead frame, the stress generated at the joint between the lead frame and the substrate can be relieved, and the reliability of electrical connection at the joint can be suppressed from being lowered.

Solution to Problem

A semiconductor device to an embodiment in an aspect of the present invention includes:

a substrate that has a plurality of conductive layers on a upper surface thereof;

a semiconductor element that disposed on the upper surface of the substrate, the semiconductor element having a first terminal on a lower surface side of the semiconductor element electrically connected to a first conductive layer provided on the upper surface of the substrate;

a sealing portion that seals the substrate and the semiconductor element;

a first lead frame that has one end in contact with a upper surface of the first conductive layer at an end extending in the side direction of the upper surface of the substrate in the sealing portion, and has the other end exposed from the sealing portion;

a first conductive bonding material that bonds between the upper surface of the first conductive layer and the lower surface side of the one end portion of the first lead frame at the end portion of the substrate, and has electrical conductivity, wherein the one end portion of the first lead frame has a first arch portion that provided so as to protrude upward along a reference direction, and a first bent portion that is connected to the first arch portion, and is located closer to a distal end side of the one end portion of the first lead frame than the first arch portion, and the first bent portion bent along the reference direction so as to protrude downward.

In the semiconductor device, wherein a lower surface side of the first bent portion is in line contact with the upper surface of the first conductive layer along the reference direction.

In the semiconductor device, wherein the first conductive bonding material is disposed along the reference direction in which the first bent portion of the first lead frame is in line contact with the upper surface of the first conductive layer, and the upper end of the first conductive layer and the lower surface side of the first bent portion are joined at the end of the substrate by the first conductive bonding material.

In the semiconductor device, wherein notches that are recessed in the reference direction are formed, in the side surfaces on both sides in the reference direction of a portion, of the first bent portion of the first lead frame, in line contact with the first conductive layer, and wherein portions of the first conductive bonding material are embedded in the notches, and joins between the upper surface of the first conductive layer, and the notches of the first bending portion.

In the semiconductor device, wherein the first lead frame is arranged, so that the side direction in which the end portion of the substrate extends and the reference direction in which a line contact region of the first bent portion extends are parallel to each other.

In the semiconductor device, wherein the first lead frame has a main body portion positioned between the one end portion and the other end portion, and the main body portion sealed in the sealing portion, and wherein a position of an upper surface of the first arch is higher than a position of an upper surface of the main body.

In the semiconductor device, wherein a width in the side direction of the first arch portion is the same as a width in the side direction other than the notch of the first bent portion.

In the semiconductor device, wherein the one end portion and the other end portion of the first lead frame have the same thickness.

In the semiconductor device, wherein the first conductive bonding material is a solder material.

In the semiconductor device, wherein the first arch portion suppresses a stress from being applied to the first bent portion of the first lead frame, by letting a stress applied to the first lead frame escape to the surrounding sealing portion.

In the semiconductor device, wherein a position of the lower surface of the first bent portion is lower than a position of the lower surface of the main body portion.

In the semiconductor device, the semiconductor device further comprises a second lead frame that has one end being in contact with the upper surface of the second conductive layer provided on the end of the upper surface of the substrate in the sealing portion, and has the other end being exposed from the sealing portion;

a second conductive bonding material that bonds between the first conductive layer and the one end of the second lead frame at the end of the substrate, and has electrical conductivity; and a connector that electrically connects the second conductive layer and the second terminal on the upper surface side of the semiconductor element, wherein the one end of the second lead frame has:

a second arch portion provided so as to protrude upward along the reference direction; and a second bent portion that is connected to the second arch portion, is located on a front end side of the one end of the second lead frame rather than the second arch portion, and is bent along the reference direction so as to protrude downward, wherein a lower side of the second bent portion is in line contact with the upper surface of the second conductive layer along the reference direction.

In the semiconductor device, wherein the semiconductor element is a MOSFET in which the first terminal is a drain terminal, the second terminal is a gate terminal, and a source terminal, which is a third terminal having a larger area than the second terminal, is provided on the upper surface of the semiconductor element.

In the semiconductor device, wherein a width of the one end portion of the first lead frame, in the reference direction, is larger than the width of the one end portion of the second lead frame, in the reference direction.

In embodiments, the semiconductor device optionally further comprises a third lead frame that has one end electrically connected to the third terminal in the sealing portion, and has the other end exposed from the sealing portion.

Effects of the Invention

The semiconductor device according to an aspect of the present invention includes a substrate that has a plurality of conductive layers on a upper surface thereof; a semiconductor element that disposed on the upper surface of the substrate, the semiconductor element having a first terminal on a lower surface side of the semiconductor element electrically connected to a first conductive layer provided on the upper surface of the substrate; a sealing portion that seals the substrate and the semiconductor element; a first lead frame that has one end in contact with upper surface of the first conductive layer at an end extending in the side direction of the upper surface of the substrate in the sealing portion, and has the other end exposed from the sealing portion; a first conductive bonding material that bonds between the upper surface of the first conductive layer and the lower surface side of the one end portion of the first lead frame at the end portion of the substrate, and has electrical conductivity.

Furthermore, the one end portion of the first lead frame has: a first arch portion that provided so as to protrude upward along a reference direction, and a first bent portion that is connected to the first arch portion, and is located closer to a distal end side of the one end portion of the first lead frame than the first arch portion, and the first bent portion bent along the reference direction so as to protrude downward.

Furthermore, notches that recessed in the reference direction are formed, in the side surfaces on both sides in the reference direction of a portion, of the first bent portion of the first lead frame, in line contact with the first conductive layer. And, portions of the first conductive bonding material are embedded in the notches, and joins between the upper surface of the first conductive layer, and the notches of the first bending portion.

As described above, in the semiconductor device according to the present invention, for example, when a thermal stress is applied, the stress applied to the first lead frame can be released to the peripheral sealing portion, by the first arch portion provided on the first lead frame.

Since the first bent portion at the tip of the first lead frame is in line contact with the substrate, it is possible to ensure the thickness of the conductive bonding material (the solder material) around the contact portion.

Further, for example, the notches are formed on both sides of the first bent portion. This facilitates bending of the first bent portion. Furthermore, the solder flows into the notches. Thereby, the fixation by a conductive bonding material can be ensured.

Thus, in the semiconductor device of the present invention, when stress is applied to the lead frame, the stress generated at the joint between the lead frame and the substrate can be relieved.

EMBODIMENTS FOR CARRYING OUT THE INVENTION

Hereinafter, embodiments according to the present invention will be described with reference to the drawings.

Figure 1:
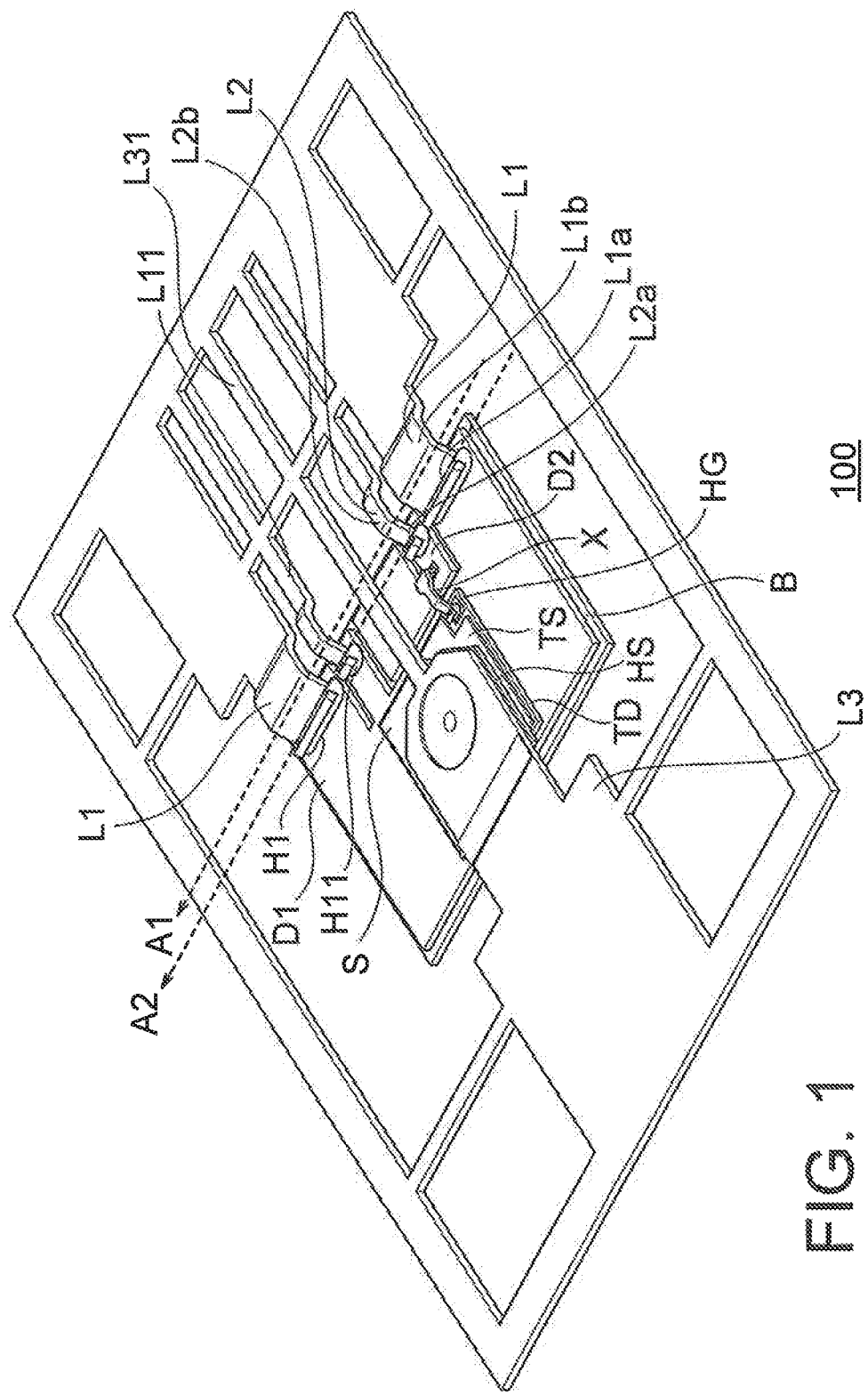
FIG. 1 is a perspective view showing an example of a configuration of a semiconductor device 100 before sealing.
Figure 2:
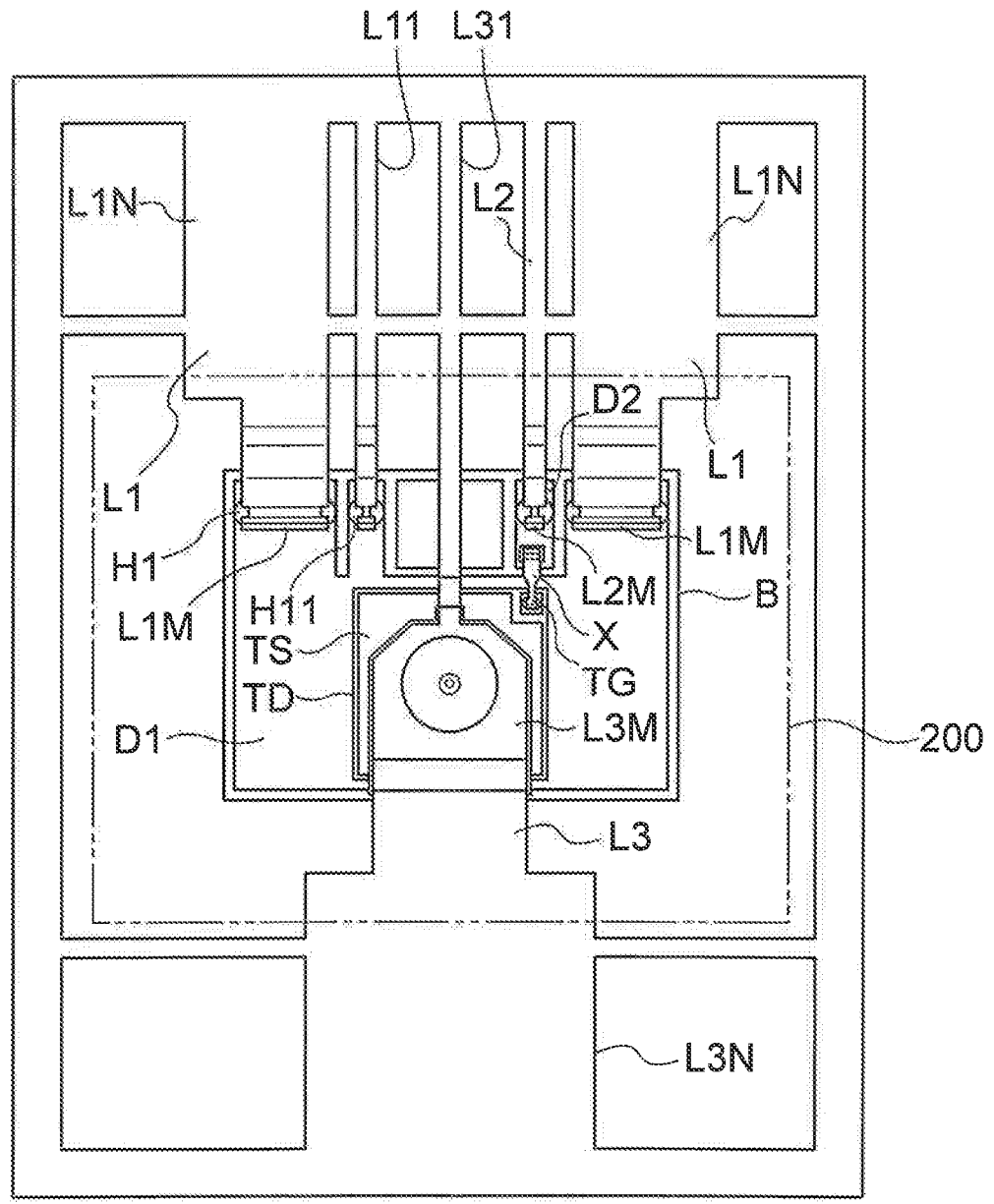
FIG. 2 is a top view showing an example of the configuration of the semiconductor device 100 after sealing and before cutting the lead frame.
Figure 3:
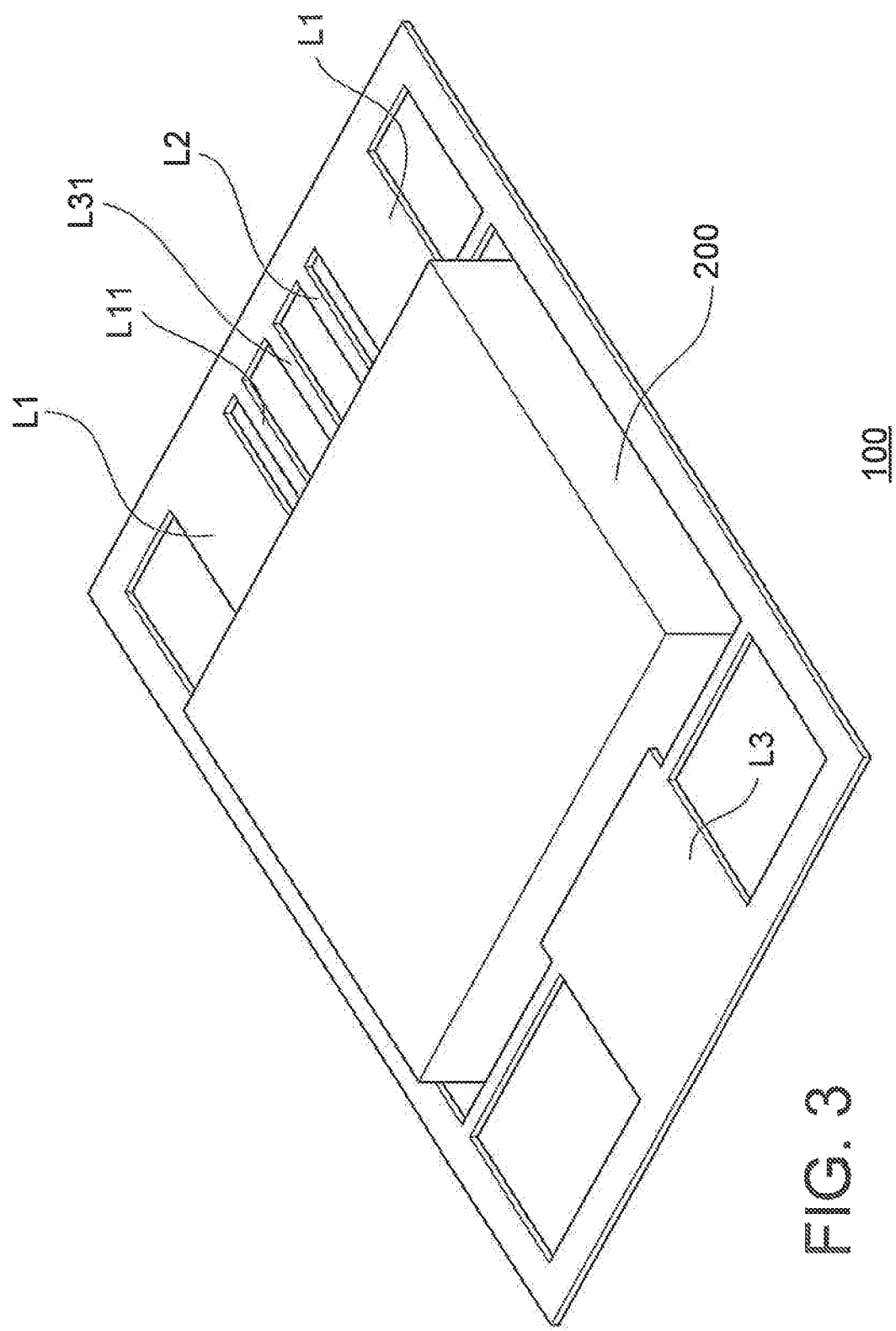
FIG. 3 is a perspective view showing an example of the configuration of the semiconductor device 100 after sealing and before cutting the lead frame.
Figure 4:
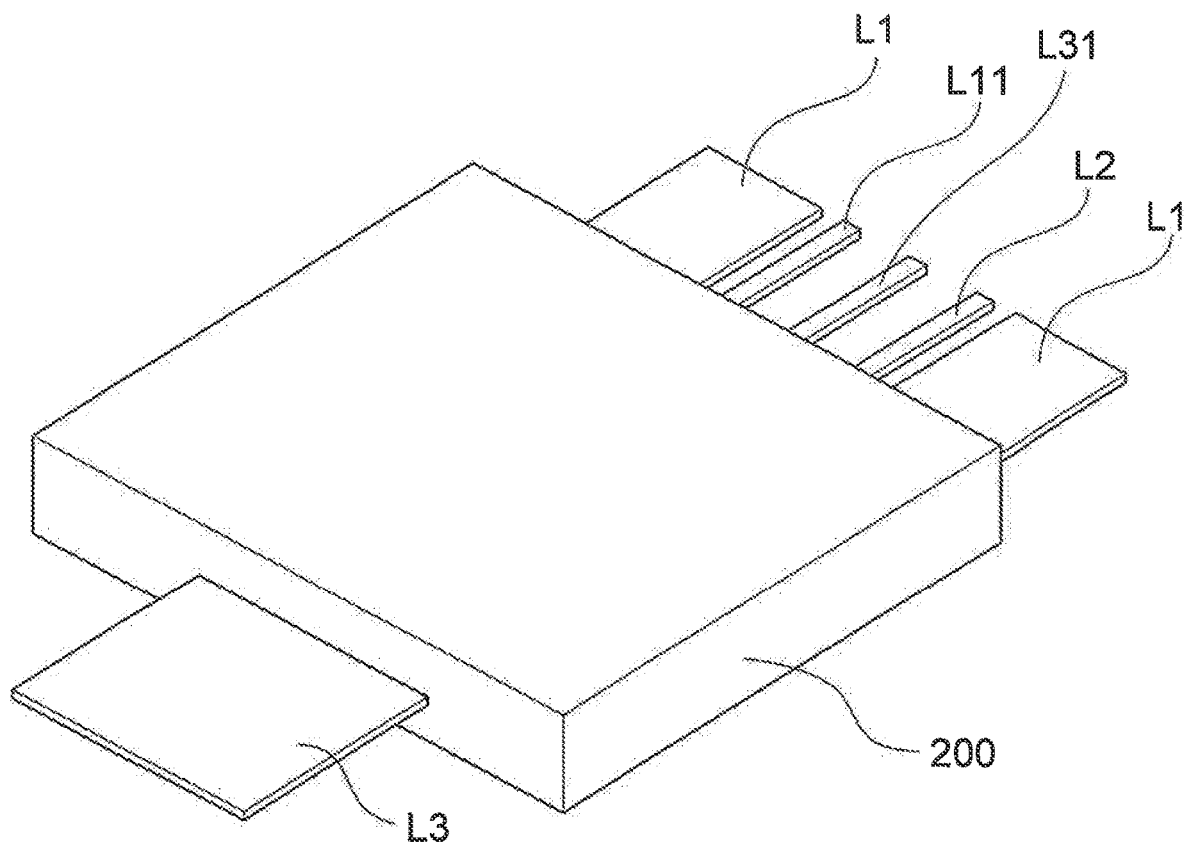
FIG. 4 is a perspective view showing an example of the configuration of the semiconductor device 100 after the lead frame is cut.

FIG. 1 is a perspective view showing an example of a configuration of a semiconductor device 100 before sealing. FIG. 2 is a top view showing an example of the configuration of the semiconductor device 100 after sealing and before cutting the lead frame. FIG. 3 is a perspective view showing an example of the configuration of the semiconductor device 100 after sealing and before cutting the lead frame. FIG. 4 is a perspective view showing an example of the configuration of the semiconductor device 100 after the lead frame is cut. In the example of FIG. 1, a case where there are two first lead frames L1 is shown. In the example of FIG. 2, the sealing member is illustrated as being transmitted.

Figure 5A:
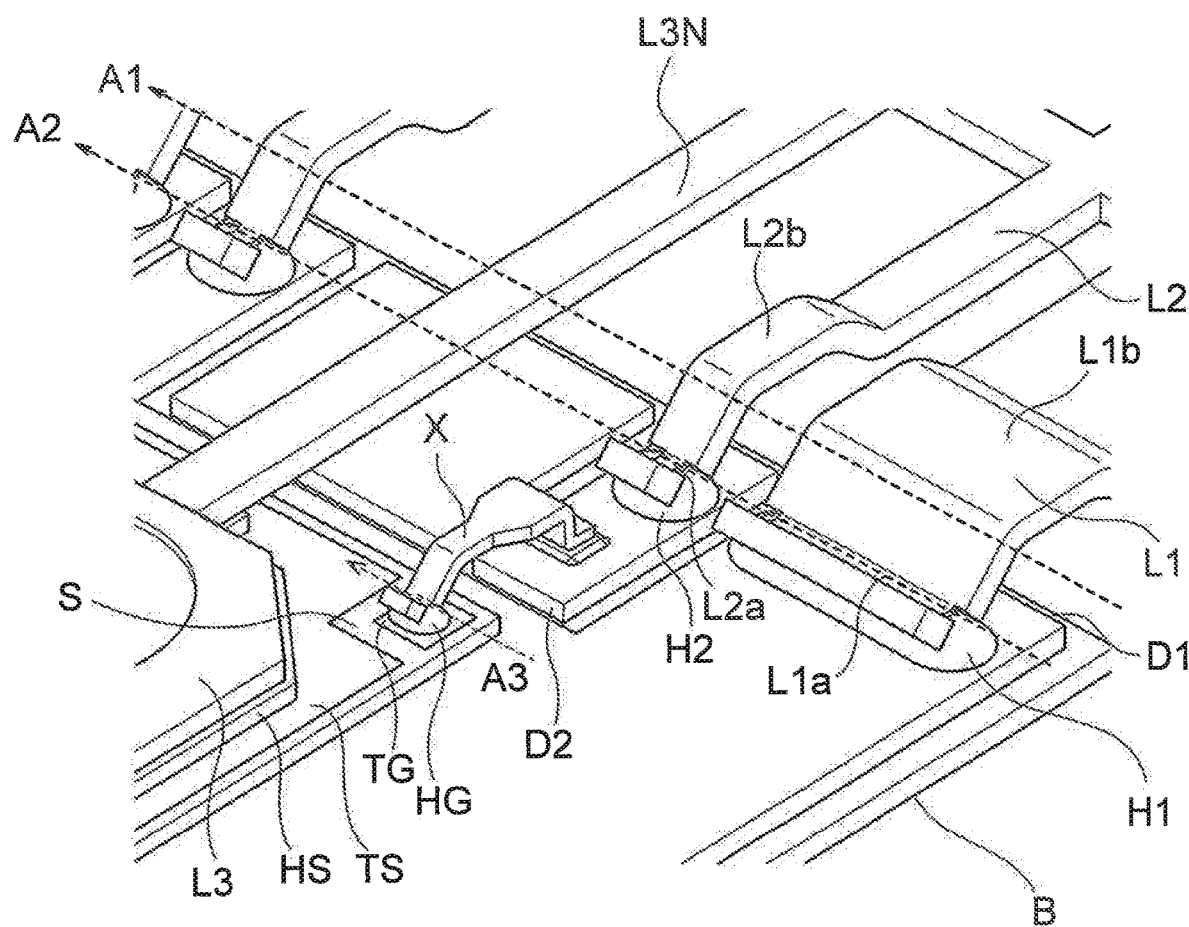
FIG. 5A is an enlarged perspective view of a region in the vicinity of the first and second lead frames L1, L2 and the connector X of the semiconductor device 100 shown in FIG. 1.
Figure 5B:
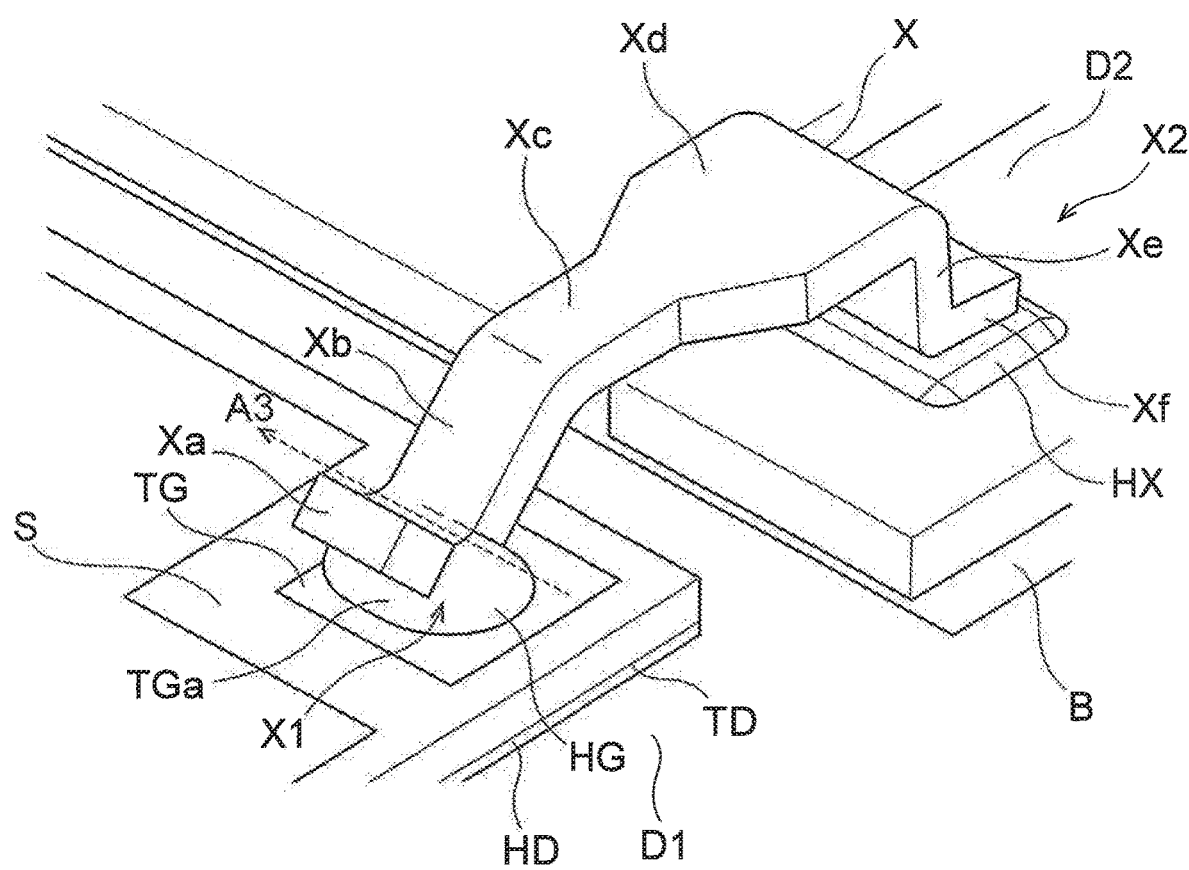
FIG. 5B is a perspective view further enlarging a region in the vicinity of the connector X shown in FIG. 5A.
Figure 5C:
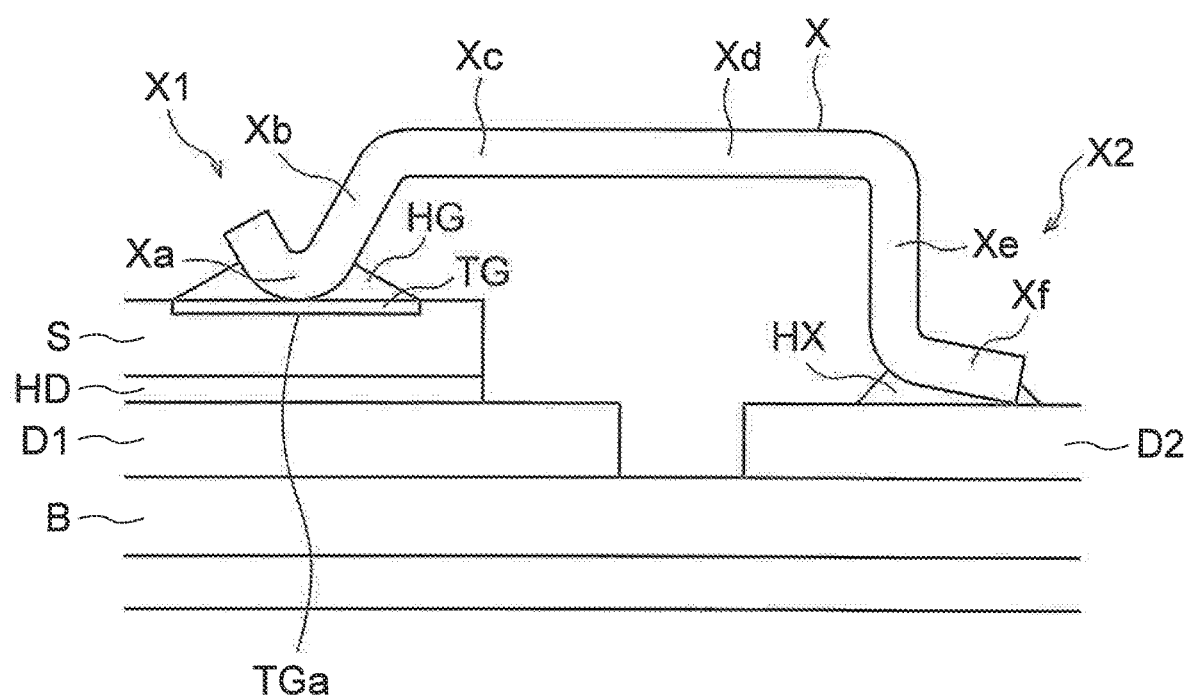
FIG. 5C is a side view showing an example of a side surface of a region in the vicinity of the connector X shown in FIG. 5B.

FIG. 5A is an enlarged perspective view of a region in the vicinity of the first and second lead frames L1, L2 and the connector X of the semiconductor device 100 shown in FIG. 1. FIG. 5B is a perspective view further enlarging a region in the vicinity of the connector X shown in FIG. 5A. FIG. 5C is a side view showing an example of a side surface of a region in the vicinity of the connector X shown in FIG. 5B.

For example, as shown in FIGS. 1 to 4, the semiconductor device 100 includes a substrate B, a semiconductor element S, a sealing portion 200, a first lead frame (a drain lead frame) L1, a detection lead frame L11, a first conductive bonding material H1, a drain conductive bonding material HD, a second lead frame (a control lead frame) L2, a second conductive bonding material (first control conductive bonding material) H2, a second control conductive bonding material HG, a third control conductive bonding material HX, a connector X, a third lead frame (a source lead frame) L3, a source conductive bonding material HS, and a detection lead frame L31.

As shown in FIGS. 1 and 2, the substrate B is provided with a plurality of conductive layers (a first conductive layer D1 and a second conductive layer D2) on the upper surface of the substrate B.

Further, as shown in FIGS. 1 and 2, the semiconductor element S is disposed on the upper surface of the substrate B. In the semiconductor element S, the first terminal TD on the lower surface side of the semiconductor element S is electrically connected to the first conductive layer D1 provided on the upper surface of the substrate B.

For example, as shown in FIGS. 1 and 2, the semiconductor element S includes a first terminal (a drain terminal) TD, a second terminal (a gate terminal) TG, and a third terminal (a source terminal) TS.

The first terminal TD is provided on the lower surface of the semiconductor element S and is electrically connected to the first conductive layer D1.

The second terminal TG is provided on the upper surface of the semiconductor element S, and receives a control signal (a gate signal).

The semiconductor element S is, for example, a MOSFET. In this case, the semiconductor element S is a MOSFET that provided with a first terminal TD that is a drain terminal on the lower surface of the semiconductor element S, a second terminal TG that is a gate terminal on the upper surface of the semiconductor element S, and a third terminal TS that is a source terminal on the upper surface of the semiconductor element S.

The semiconductor element S may be another semiconductor element such as IGBT other than MOSFET.

As shown in FIGS. 1 and 2, the first lead frame L1 has one end L1M electrically connected to a first terminal TD that is a drain terminal in the sealing portion 200, and has the other end L1N that is exposed from the sealing portion 200.

In particular, the first lead frame L1 is in contact with the upper surface of the first conductive layer D1 at one end portion L1M at the end portion extending in the side direction A1 of the upper surface of the substrate B in the sealing portion 200, and the other end portion L1N of the first lead frame L1 is exposed from the sealing portion 200.

The one end portion L1M of the first lead frame L1 includes a first arch portion L1b and a first bent portion L1a.

The first arch portion L1b is provided so as to protrude upward along the reference direction A2.

The first bent portion L1a is connected to the first arch portion L1b and located on the tip end side of the first bent portion L1a with respect to the first arch portion L1b. The first bent portion L1a is bent so as to protrude downward along the reference direction A2.

The lower surface side of the first bent portion L1a is in line contact with the upper surface of the first conductive layer D12 along the reference direction A2.

Further, the first conductive bonding material H1 bonds the upper surface of the first conductive layer D1 and the lower surface side of the one end L1M of the first lead frame L1 at the end of the substrate B, and the first conductive bonding material H1 has electrical conductivity.

The first conductive bonding material H1 is, for example, a solder material.

Further, one end of the detection lead frame L11 is electrically connected to the first terminal TD which is a drain terminal in the sealing portion 200, and the other end of the detection lead frame L11 is exposed from the sealing portion 200.

The detection lead frame L11 is for detecting the drain voltage of the semiconductor element S, for example.

The detection conductive bonding material H11 bonds between the first conductive layer D1 and one end of the detection lead frame L11, and has electrical conductivity.

Note that the conductive bonding material for detection H11 is, for example, a solder material.

Further, the second lead frame L2, for example, as shown in FIGS. 1 and 2, has one end portion L2M that is in contacts with an upper surface of a second conductive layer provided at an end portion of the upper surface of the substrate B in the sealing portion 200. And, the other end L2N of the second lead frame L2 is exposed from the sealing portion 200.

The second lead frame L2 is a control lead frame for transmitting the gate signal of the MOSFET (semiconductor element S) described above.

Then, at the end of the substrate B, the second conductive bonding material (the first control conductive bonding material) H2 bonds between the first conductive layer D1 and one end L2M of the second lead frame L2, and, the second conductive bonding material H2 has electrical conductivity.

Note that the second conductive bonding material H2 is, for example, a solder material.

Also, the one end portion L2M of the second lead frame L2 includes a second arch portion L2b and a second bent portion L2a.

The second arch portion L2b is provided so as to protrude upward along the reference direction A2.

The second bent portion L2a is connected to the second arch portion L2b and located on the tip side of the second bent portion L2a with respect to the second arch portion L2b, And, the second bent portion L2a is bent along the reference direction A2 so as to protrude downward.

The lower side of the second bent portion L2a is in line contact with the upper surface of the second conductive layer D2 along the reference direction A2.

Further, the width of the one end portion L1M of the first lead frame L1 in the reference direction A2 is set to be larger than the width of the one end portion L2M of the second lead frame L2 in the reference direction A2.

The third lead frame L3 has one end L3M electrically connected to the third terminal TS which is a source terminal on the upper surface of the semiconductor element S, and has the other end L3N exposed from the sealing portion 200.

The source conductive bonding material HS bonds between the third terminal TS and the one end L3M of the third lead frame L3, and has electrical conductivity.

Note that the source conductive bonding material HS is, for example, a solder material.

Also, the one end of the detection lead frame L31 is electrically connected to the third terminal TS which is the source terminal on the upper surface of the semiconductor element S (that is, the one end of the detection lead frame L31 extends from the third lead frame L3). And, the other end portion of the detection lead frame L31 is exposed from the sealing portion 200.

The detection lead frame L31 is for detecting the voltage of the source of the semiconductor element S, for example.

Further, as shown in FIGS. 1 to 4, the sealing portion 200 is configured to seal the substrate B and the semiconductor element S.

First Embodiment

Here, in the example shown in FIGS. 5A, 5B, and 5C, the area of the source terminal that is the third terminal TS on the upper surface of the semiconductor element S is larger than the area of the second terminal TG that is the gate terminal. It is set to be.

The connector X is electrically connected between the second conductive layer D2 and the second terminal (the gate terminal) TG on the upper surface side of the semiconductor element S as shown in FIGS. 5A, 5B, and 5C, for example.

For example, as shown in FIGS. 5A, 5B, and 5C, one end X1 of the connector X is in contact with the upper surface of the second terminal TG of the semiconductor element S in the sealing portion 200. And, the other end X2 of the connector X is in contact with the second conductive layer D.

Here, the second control conductive bonding material HG bonds between the upper surface of the second terminal TG of the semiconductor element S and the one end X1 of the connector X. And the second control conductive bonding material HG has electrical conductivity.

Note that the second control conductive bonding material HG is, for example, a solder material.

Further, the third control conductive bonding material HX bonds the second conductive layer D2 of the substrate B and the other end X2 of the connector X. And, the third control conductive bonding material HX has electrical conductivity.

Note that the third control conductive bonding material HX is, for example, a solder material.

That is, the connector X is electrically connected between the second conductive layer D2 and the second terminal (gate terminal) TG on the upper surface side of the semiconductor element S, with the second and third control conductive bonding materials HG and HX.

The one end X1 of the connector X includes, for example, a horizontal portion Xc, a first inclined portion Xb, a control bending portion Xa, and a reference portion Xd, as shown in FIGS. 5B and 5C.

Furthermore, the horizontal portion Xc is arrange positioned in parallel with the upper surface of the board substrate B, as shown to FIG. 5A, FIG. 5B, and FIG. 5C, for example.

Further, for example, as shown in FIGS. 5A, 5B, and 5C, the first inclined portion Xb is connected to the horizontal portion Xc. and is located on the distal end side of the one end portion X1 with respect to the horizontal portion Xc. And, the first inclined portion Xb has a shape inclined downward from the horizontal portion Xc.

Further, for example, as shown in FIG. 5B, the control bending portion Xa is connected to the first inclined portion Xb, and located at the tip end of the one end portion X1. And, the control bending portion Xa is bent along the bending axis direction A3 so as to protrude downward.

The lower surface side of the control bent portion Xa is in contact with the upper surface of the second terminal TG. In particular, the lower surface side of the control bending portion Xa is in contact with the center TGa of the upper surface of the second terminal TG.

Further, the lower surface side of the control bending portion Xa is in line contact with the upper surface of the second terminal TG in the bending axis direction A3, for example, as shown in FIG. 5C.

Note that the width of the bending portion for control Xa in the bending axis direction A3 is the same as the width of the first inclined portion Xb in the bending axis direction A3.

Further, the reference portion Xd is connected to the horizontal portion Xc on the side opposite to the first inclined portion Xb. Further, the reference portion Xd has a width larger than the width of the horizontal portion Xc.

The width of the bending portion for control Xa in the bending axis direction A3 is set to be smaller than the width of the reference portion Xd in the bending axis direction A3.

Here, as shown in FIGS. 5A, 5B, and 5C, for example, the control bending portion Xa of the connector X is in line contact with the upper surface of the second terminal TG, and is arranged along the bending axis direction A3. The second control conductive bonding material HG bonds between the upper surface of the second terminal TG and the lower surface side of the control bent portion Xa.

And, the upper surface of the second terminal TG has a rectangular shape as shown in FIGS. 5A, 5B, and 5C, for example.

The second control conductive bonding material HG is positioned so as to surround the center TGa on the upper surface of the second terminal TG, as shown in FIG. 5B. And, the second control conductive bonding material HG bonds between the lower surface of the control bending portion Xa of the connector X and the upper surface of the second terminal TG.

For example, as shown in FIG. 5C, the lower surface side of the control bending portion Xa of the connector X and the upper surface of the second terminal TG are in line contact, in the bending axis direction A3 passing through the center TGa on the upper surface of the second terminal TG.

The bending axis direction A3 is parallel to one side of the rectangle of the second terminal TG, as shown in FIGS. 5A, 5B, and 5C, for example.

On the other hand, the other end portion X2 of the connector X includes a second inclined portion Xe and a tip end portion Xf.

The second inclined portion Xe is connected to the reference portion Xd on the side opposite to the horizontal portion Xc, and is located on the tip end side of the other end portion X2 with respect to the reference portion Xd. And, the second inclined portion Xe has a shape inclined downward from the reference portion Xd.

And the front end tip portion Xf is connected with the 2nd inclination portion Xe, for example, as shown to FIG. 5A, FIG. 5B, and FIG. 5C. And the front end tip portion Xf is located in the front end tip of the other end portion X2.

The tip end portion Xf is bonded to the upper surface of the second conductive layer D2 of the substrate B by the third control conductive bonding material HX.

The height of the lower surface of the control bending portion Xa of the connector X from the upper surface of the substrate B is set to be higher than the height of the lower surface of the tip end portion Xf from the upper surface of the substrate B.

Note that the thickness in the vertical direction of the connector X is set to be thinner than the thickness in the vertical direction of the second lead frame L2.

This makes it easy to bend the connector X miniaturized.

Second Embodiment

Figure 6:
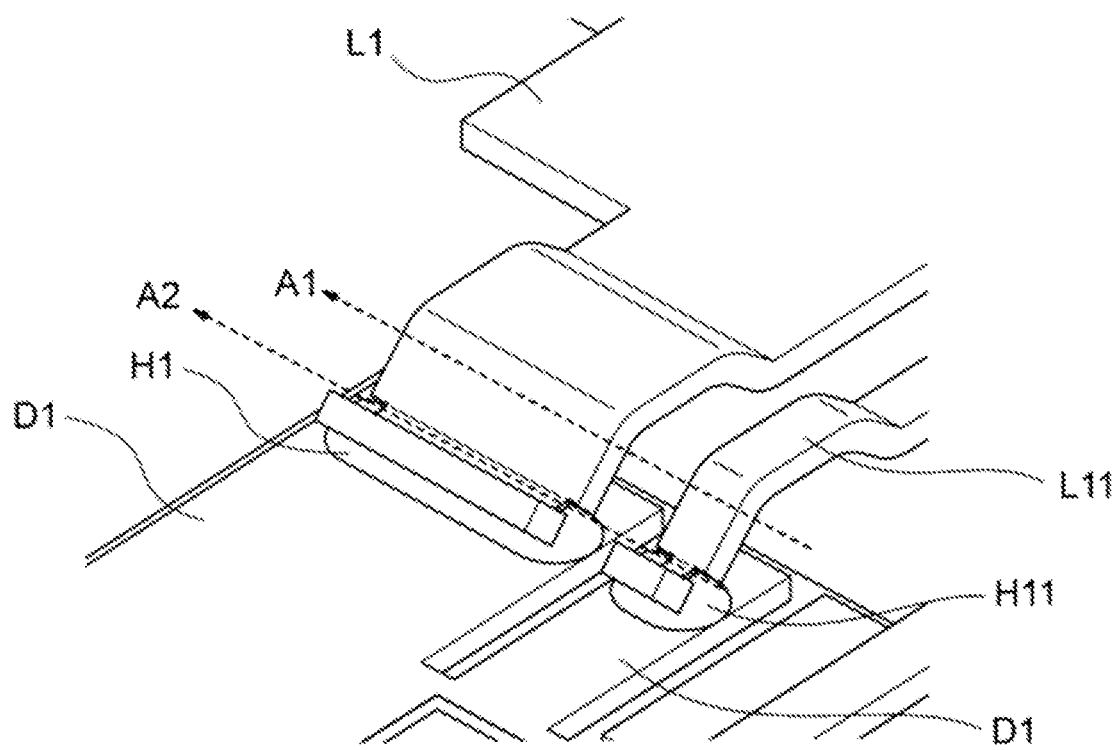
FIG. 6 is an enlarged perspective view of a region in the vicinity of the first lead frame L1 and the detection lead frame L11 of the semiconductor device 100 shown in FIG. 1.
Figure 7:
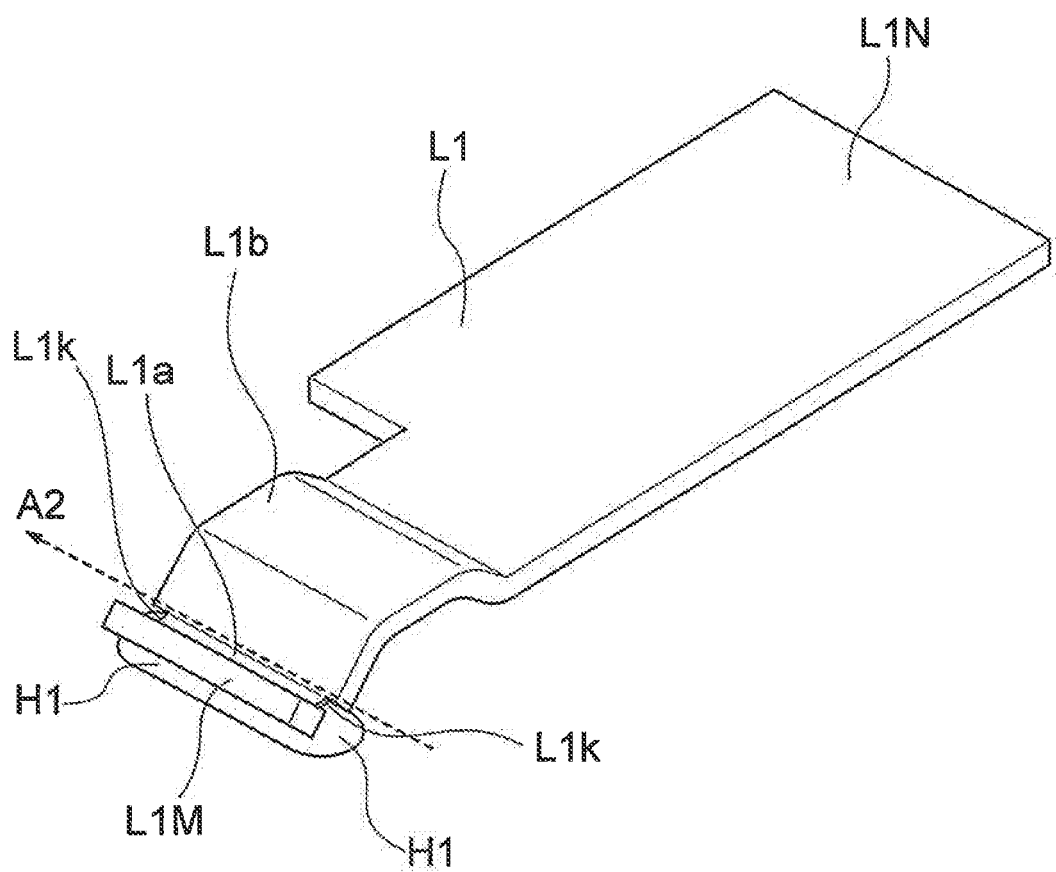
FIG. 7 is a perspective view showing an example of a configuration of the first lead frame L1 and the first conductive bonding material H1 shown in FIG. 6.
Figure 8A:
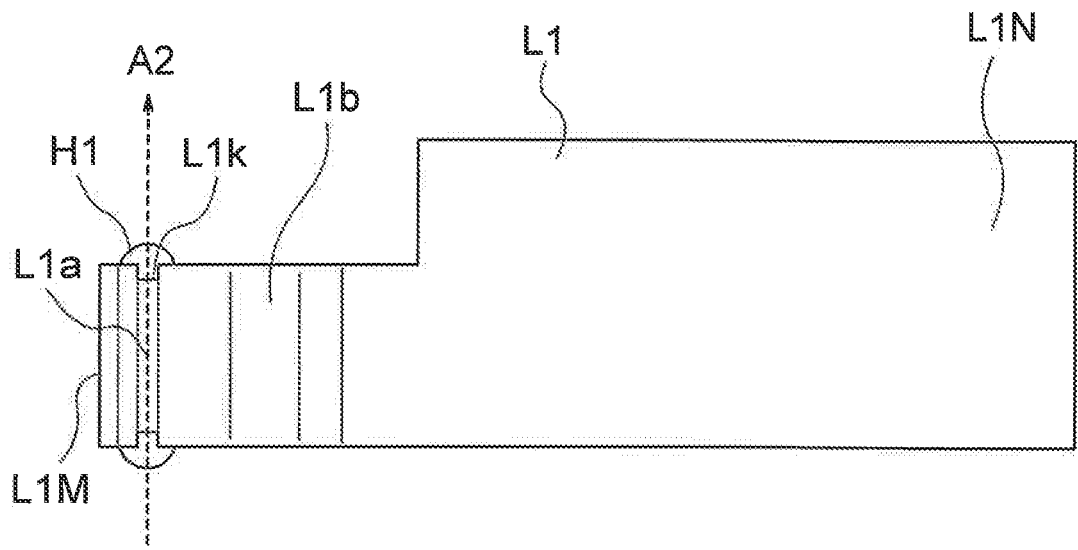
FIG. 8A is a top view showing an example of the configuration of the first lead frame L1 and the first conductive bonding material H1 shown in FIG. 7.
Figure 8B:
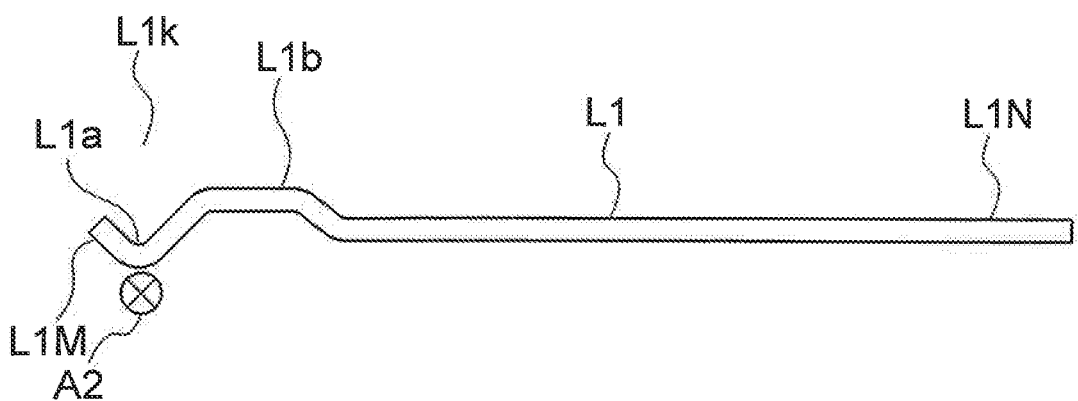
FIG. 8B is a cross sectional view showing an example of the configuration of the first lead frame L1 shown in FIG. 8A.
Figure 9:
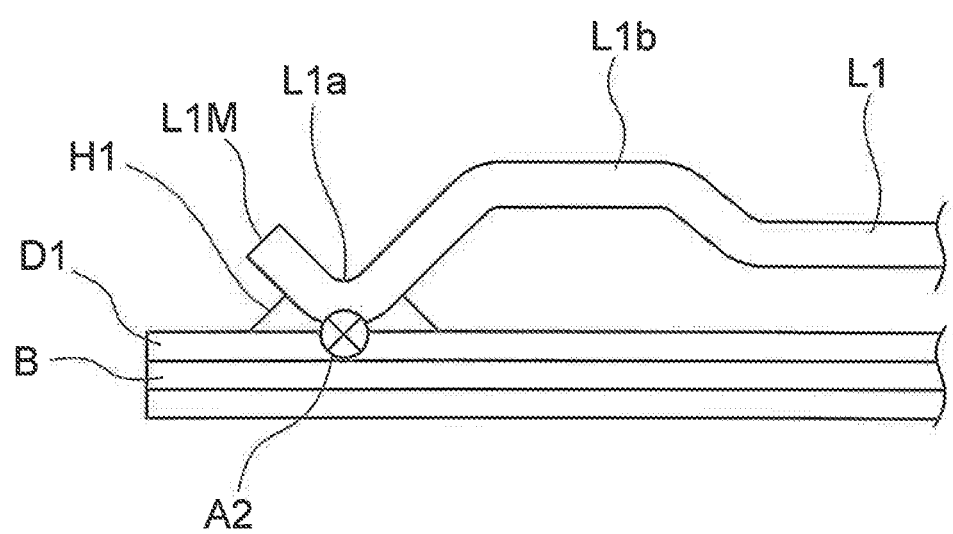
FIG. 9 is a cross sectional view showing an example of a configuration in the vicinity of one end L1M of the first lead frame L1 shown in FIG. 6.

FIG. 6 is an enlarged perspective view of a region in the vicinity of the first lead frame L1 and the detection lead frame L11 of the semiconductor device 100 shown in FIG. 1. FIG. 7 is a perspective view showing an example of a configuration of the first lead frame L1 and the first conductive bonding material H1 shown in FIG. 6. FIG. 8A is a top view showing an example of the configuration of the first lead frame L1 and the first conductive bonding material H1 shown in FIG. 7. FIG. 8B is a cross sectional view showing an example of the configuration of the first lead frame L1 shown in FIG. 8A. FIG. 9 is a cross sectional view showing an example of a configuration in the vicinity of one end L1M of the first lead frame L1 shown in FIG. 6.

For example, as shown in FIGS. 6 to 9, one end portion L1M of the first lead frame L1 includes a first arch portion L1b and a first bent portion L1a.

The first arch portion L1b is provided so as to protrude upward along the reference direction A2.

The first bent portion L1a is connected to the first arch portion L1b. And, the first bending portion L1a is located in the front end side rather than the first arch portion L1b. Furthermore, the first bent portion L1a is bent along the reference direction A2 so as to protrude downward.

The lower surface side of the first bent portion L1a of the first lead frame L1 is in line contact with the upper surface of the first conductive layer D12, along the reference direction A2.

The first conductive bonding material H1 is arranged, along the reference direction A2 that the first bent portion L1a of the first lead frame L1 is in line contact with the upper surface of the first conductive layer D1. The first conductive bonding material H1 bonds between the upper surface of the first conductive layer D1 and the lower surface side of the first bent portion L1a, at the end of the substrate B.

Here, as shown in FIGS. 6 to 9, the notches L1k recessed in the reference direction A2 are formed on the side surfaces on both sides of the portion, in line contact with the first conductive layer D1 in the reference direction A2, of the first bent portion L1a of the first lead frame L1.

Furthermore, a portion of the first conductive bonding material H1 is embedded in the notch L1k, and the portion of the first conductive bonding material H1 bonds between the upper surface of the first conductive layer D1 and the notches L1k of the first bent portion L1a.

As shown in FIGS. 6 to 9, for example, the first lead frame L1 is arranged, so that the side direction A1 in which the end portion of the substrate B extends and the reference direction A2 in which the line contact area of the first bent portion L1a extends are parallel to each other.

Further, the first lead frame L1 has a main body portion that is located between the one end portion L1M and the other end portion L1N, and the main body portion is sealed in the sealing portion 200. A position of the upper surface of the first arch portion L1b is higher than a position of the upper surface of the main body portion.

A width in the side direction A1 of the first arch portion L1b is the same as a width in the side direction A1 other than the notches L1k of the first bent portion L1a. That is, a width in the side direction A1 of the first arch portion L1b is larger than a width in the side direction A1 of the notches L1k of the first bent portion L1a.

Further, for example, the one end L1M and the other end L1N of the first lead frame L1 have the same thickness (that is, the first lead frame L1 is not coined).

Note that a position of the lower surface of the first bent portion L1a is set to be lower than a position of the lower surface of the main body.

Then, the first arch portion L1b releases the stress applied to the first lead frame L1 to the peripheral sealing portion 200. Thereby, an application of stress to the first bent portion L1a of the first lead frame L1 is suppressed.

Third Embodiment

In the third embodiment, an example of a method for manufacturing the semiconductor device 100 having the configuration as described above will be described.

FIGS. 10 to 13 are diagrams illustrating an example of a process of a method for manufacturing the semiconductor device 100.

Figure 10:
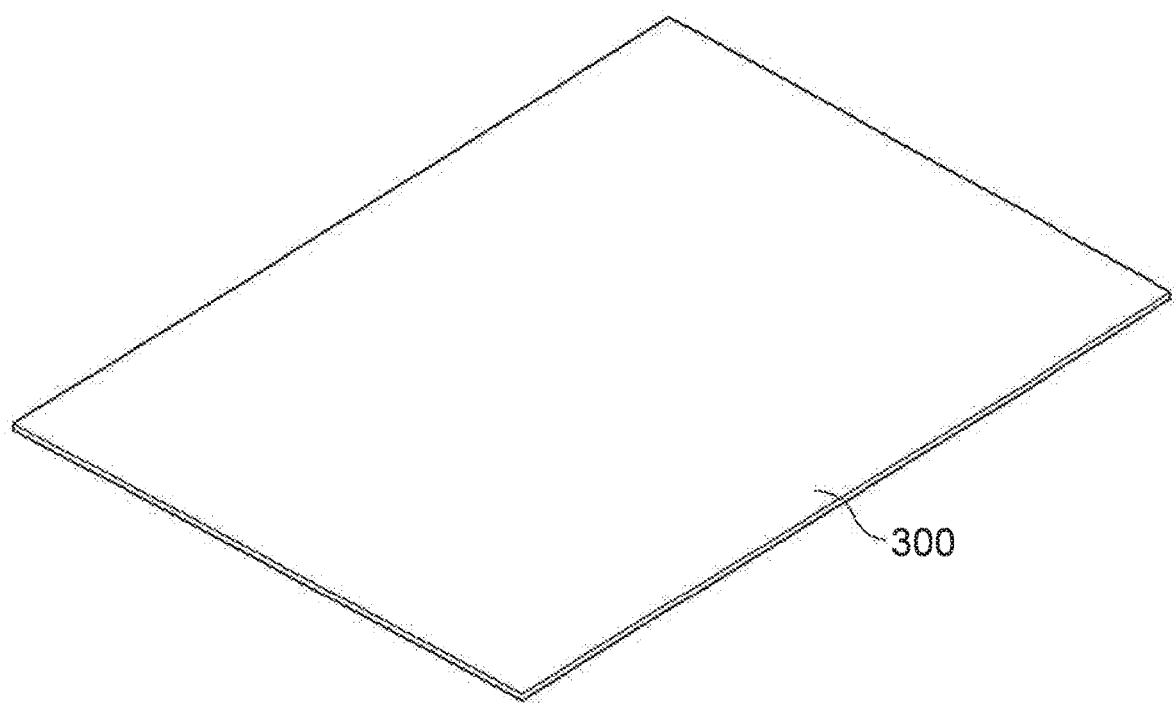
FIG. 10 is a diagram illustrating an example of a process of a method for manufacturing the semiconductor device 100.

First, as shown in FIG. 10, for example, a metal plate 300 made of a metal such as copper is prepared.

Figure 11:
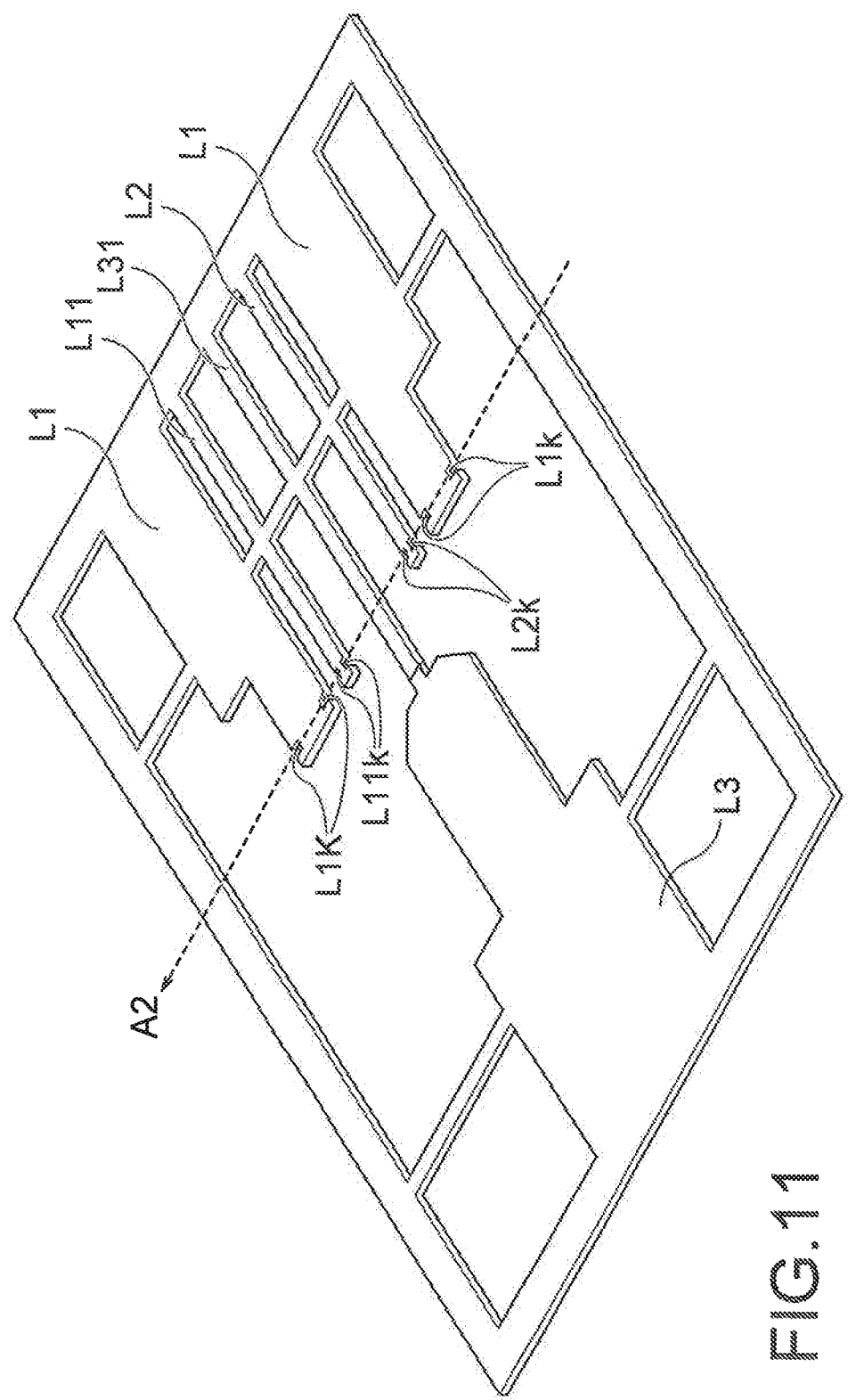
FIG. 11 is a diagram illustrating an example of a process of the method for manufacturing the semiconductor device 100, subsequent to FIG. 10.

Then, as shown in FIG. 11, the portions of the first to third lead frames L1 to L3 are simultaneously formed, by selectively punching out the metal plate 300.

In particular, when the first lead frame L1 is formed, the notches L1k are formed on both side surfaces in the reference direction A2 of the portion, where the first bent portion L1a of the first lead frame L1 is formed, that is in line contact with the first conductive layer D1. The notches L1k are recessed in the reference direction A2.

Similarly, when the second lead frame L2 is formed, the notches L2k are formed on the side surfaces on both sides in the reference direction A2 of portion, where the first bent portion L2a of the second lead frame L2 is formed, that is in line contact with the first conductive layer D1. The notches L2k are recessed in the reference direction A2.

Figure 12:
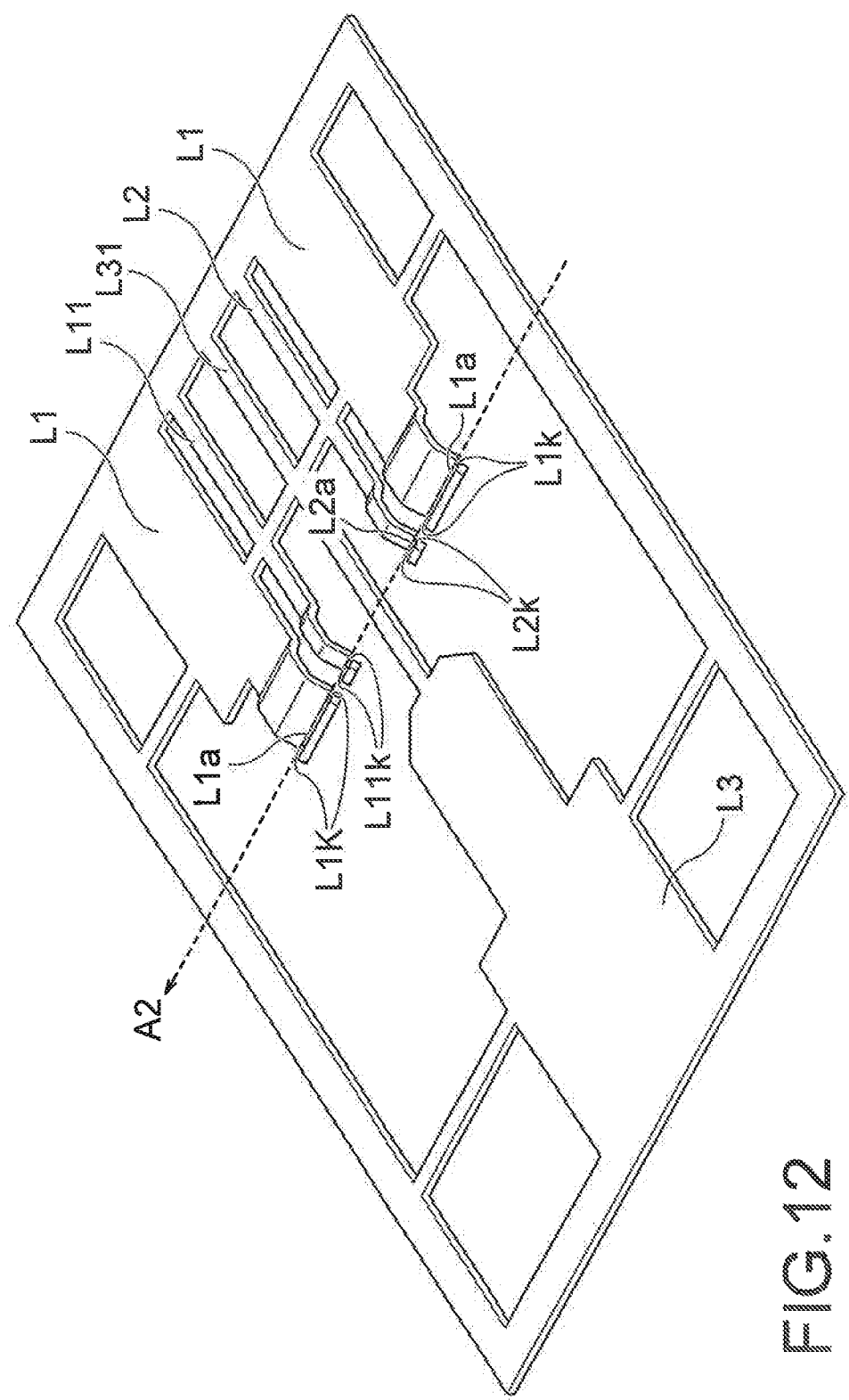
FIG. 12 is a diagram illustrating an example of a process of the method for manufacturing the semiconductor device 100, subsequent to FIG. 11.

Then, as shown in FIG. 12, one end portions of the first and second lead frames L1 and L2 are bent along the reference direction A2 so as to protrude downward. Thereby, the first and second bending portions L1a and L2a are formed.

Figure 13:
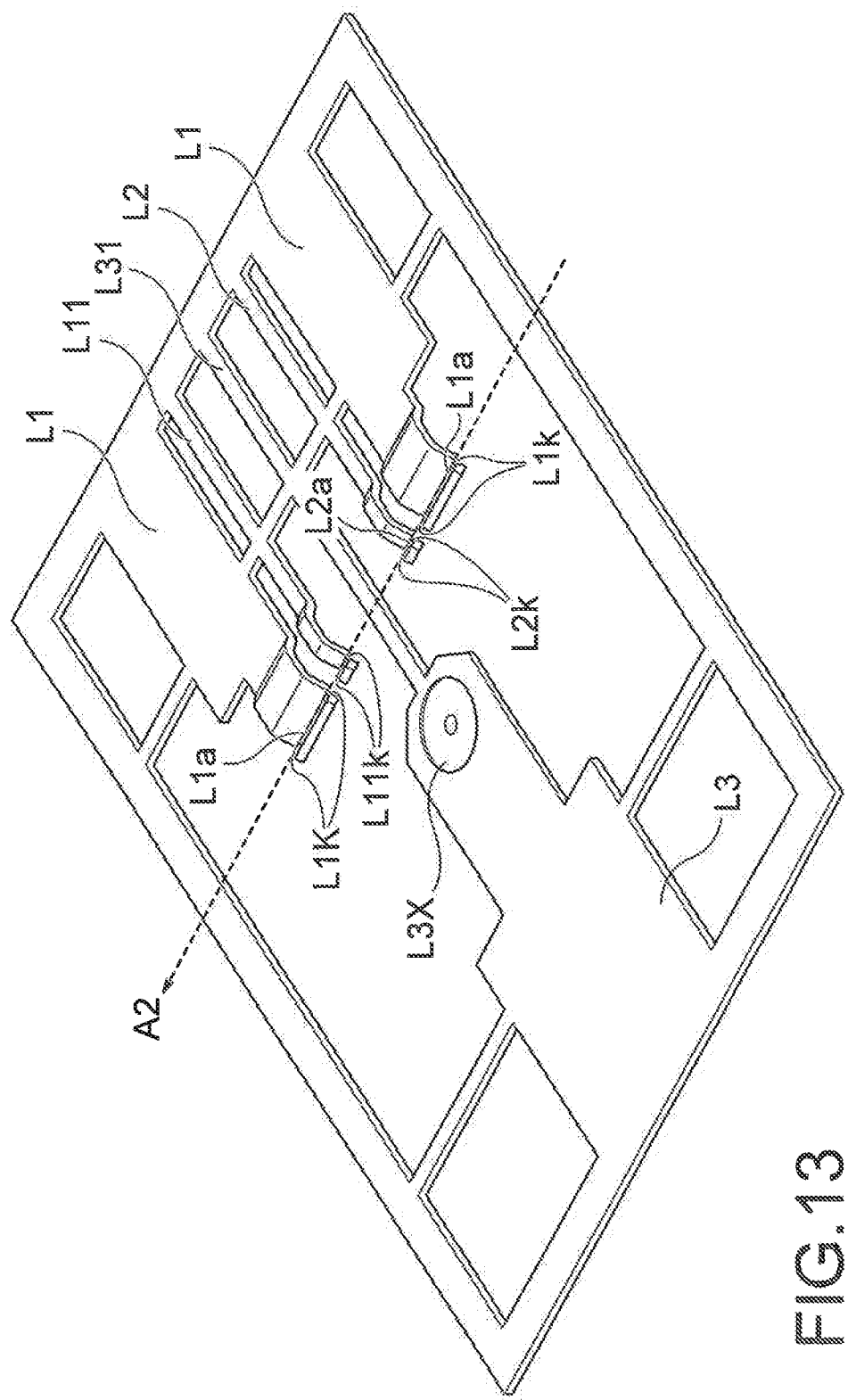
FIG. 13 is a diagram illustrating an example of a process of the method for manufacturing the semiconductor device 100, subsequent to FIG. 12.

Then, as shown in FIG. 13, predetermined processing is performed on the third lead frame L3 to form a predetermined shape L3X.

Through these steps, for example, the first to third lead frames L1 to L3 shown in FIG. 1 are formed.

On the other hand, a substrate B having a first conductive layer D1 and a second conductive layer D2 provided on the upper surface is prepared.

Then, the semiconductor element S is disposed on the upper surface of the substrate B. The semiconductor element S has a first terminal TD provided on the lower surface of the semiconductor element S and the first terminal TD electrically connected to the first conductive layer D1. And the semiconductor element S has a second terminal TG provided on the upper surface of the semiconductor element S, and a control signal is input to the second terminal TG. Then, the first terminal TD is joined to the first conductive layer D1, so that the first conductive layer D1 and the first terminal TD are electrically connected.

Thereafter, as shown in FIGS. 5A to 5C, one end of the first lead frame L1 is brought into contact with the upper surface of the first conductive layer D1 provided at the end of the upper surface of the substrate B. Then, the first conductive bonding material H1 joins between the upper surface of the first conductive layer and the lower surface side of the first bent portion of the first lead frame L1 at the end of the substrate B. Further, portions of the first conductive bonding material H1 is embedded in the notches L1k. Thereby, the upper surface of the first conductive layer D1 and the notches L1k of the first bent portion L1a are joined.

Similarly, one end of the second lead frame L2 is brought into contact with the upper surface of the second conductive layer D2 provided at the end of the upper surface of the substrate B. Then, the second conductive layer D2 and one end portion of the second lead frame L2 are joined at the end portion of the substrate B by the first control conductive bonding material H2 having electrical conductivity (FIG. 1). At this time, a portion of the second conductive bonding material H2 is embedded in the notches L2k. Thereby, the upper surface of the second conductive layer D2 and the notches L2k of the second bent portion L2a are joined.

Further, one end of the third lead frame L3 is brought into contact with the upper surface of the third terminal TS on the upper surface of the semiconductor element S. Then, the third terminal TS and one end portion of the third lead frame L3 are joined by the source conductive joint material HS having electrical conductivity (FIG. 1).

Then, one end portion X1 of the connector X is brought into contact with the upper surface of the second terminal TG of the semiconductor element S, and the other end portion X2 of the connector X is brought into contact with the second conductive layer D2. Further, the upper surface of the second terminal of the semiconductor element S and the one end portion X1 of the connector X are bonded together by the second control conductive bonding material HG having electrical conductivity. Further, the second conductive layer D2 of the substrate B and the other end portion X2 of the connector X are joined by the third control conductive joining material HX having electrical conductivity.

As shown in FIGS. 2 and 3, the substrate B, the semiconductor element S, the connector X, the first to third lead frames L1 to L3, and the one ends of the detection lead frames L11 and L31 are sealed by the sealing portion 200.

Thereafter, by cutting the first to third lead frames L1 to L3 and the detection lead frames L11 and L31, the semiconductor device 100 shown in FIG. 4 is manufactured.

Thus, in this embodiment, after punching the outer shape of the metal plate 300, by two steps of bending one end of the first and second lead frames L1 and L2, first and second lead frames L1 and L2 can be formed. This reduces processing costs, and since the solder thickness is ensured in the outer peripheral portion of a junction portion, the stress relaxation is possible.

Further, the notches (the recess portions) L1k and L2k are formed on both sides of the first and second bent portions L1a and L2a at the ends (one end portions) of the first and second lead frames L1 and L2. Thereby, the first and second bent portions L1a and L2a can be easily bent. Furthermore, since the solder flows into the notches L1k and L2k, fixing by the solder can be ensured.

As described above, the tips of the first and second lead frames L1 and L2 are bent by bending. Therefore, the bent first and second bent portions L1a and L2a are connected to the first and second conductive layers D1 and D2 by line contact. For this reason, it is possible to reduce the amount of solder material dispensed.

As described above, the semiconductor module 100 according to an aspect of the present invention comprises: a substrate B that has a plurality of conductive layers D1 and D2 on a upper surface thereof; a semiconductor element that disposed on the upper surface of the substrate, the semiconductor element S having a first terminal on a lower surface side of the semiconductor element electrically connected to a first conductive layer D1 provided on the upper surface of the substrate; a sealing portion that seals the substrate and the semiconductor element; a first lead frame L1 that has one end in contact with a upper surface of the first conductive layer at an end extending in the side direction A1 of the upper surface of the substrate in the sealing portion, and has the other end exposed from the sealing portion; a first conductive bonding material H1 that bonds between the upper surface of the first conductive layer and the lower surface side of the one end portion of the first lead frame at the end portion of the substrate, and has electrical conductivity.

Furthermore, the one end portion of the first lead frame has: a first arch portion L1b that provided so as to protrude upward along a reference direction, and a first bent portion L1b that is connected to the first arch portion, and is located closer to a distal end side of the one end portion of the first lead frame than the first arch portion, and the first bent portion bent along the reference direction so as to protrude downward.

Furthermore, notches that recessed in the reference direction are formed, in the side surfaces on both sides in the reference direction of a portion, of the first bent portion of the first lead frame, in line contact with the first conductive layer. And, portions of the first conductive bonding material are embedded in the notches, and joins between the upper surface of the first conductive layer, and the notches of the first bending portion.

As described above, in the semiconductor device of the present invention, for example, when a thermal stress is applied, the stress applied to the first lead frame L1 can be released to the peripheral sealing portion, by the first arch portion L1b provided in the first lead frame L1.

And, since the first bent portion L1a at the tip of the first lead frame is in line contact with the substrate B, it becomes possible to secure the thickness of the conductive bonding material (solder material) around the contact portion.

Further, for example, notches L1k are formed on both sides of the first bent portion L1a. This facilitates bending of the first bent portion L1a, and the solder flows into the notch L1K. Thereby, the fixation by a conductive bonding material can be ensured.

Thus, in the semiconductor device of the present invention, when stress is applied to the lead frame, the stress generated at the joint between the lead frame and the substrate can be relieved.

While certain embodiments have been described, these embodiments have been presented by way of example only, and are not intended to limit the scope of the inventions. The embodiments may be embodied in a variety of other forms. Furthermore, various omissions, substitutions and changes in the form of the methods and systems described herein may be made without departing from the spirit of the inventions. The embodiments and their modifications are included in the scope and the subject matter of the invention, and at the same time included in the scope of the claimed inventions and their equivalents.

EXPLANATION OF REFERENCES

100: semiconductor device
B: substrate
S: semiconductor element
200: sealing portion
L1: first lead frame (a drain lead frame)
L11: detection lead frame
H1: a first conductive bonding material
L2: second lead frame
H2: second conductive bonding material (first control conductive bonding material)
HG: second control conductive bonding material
HX: third control conductive bonding material
X: connector
L3: a third lead frame
L31: detection lead frame

The invention claimed is:

1. A semiconductor device, comprising:
a substrate;
a semiconductor element that is mounted on the substrate;
a first lead terminal that is connected to a conductive layer on the substrate via a conductive bonding material; and
a sealing portion that seals the substrate and the semiconductor element,
wherein the first lead terminal includes:
a main body portion that is arranged in the sealing portion,
a first arch portion that is connected to the main body portion and is bent so as to project upward, and
a first bent portion that is connected to the first arch portion and is bent so as to project downward,
wherein notches are recessed in a width direction of the first bent portion and are formed on both side surfaces of the first bent portion in the width direction, the width direction being a direction of a width between the both side surfaces of the first bent portion, and
wherein the first lead terminal is connected to the conductive layer on the substrate, and wherein a lower end of the first bent portion comes into contact with the conductive layer on the substrate, and the conductive bonding material arranged on a surface of the conductive layer is bonded to a lower surface of the first bent portion and fills the notches.

2. The semiconductor device according to claim 1,
wherein the lower end of the first bent portion is in line contact with the conductive layer on the substrate.

3. The semiconductor device according to claim 2,
wherein, in the first lead terminal, the upper end of the first arch portion protrudes upward from an upper surface of the main body portion, and the lower end of the first bent portion protrudes below a lower surface of the main body portion.

4. The semiconductor device according to claim 1,
wherein the first arch portion lets a stress applied to the first lead terminal escape to the surrounding sealing portion.

* * * * *